United States Patent [19]

Lee et al.

[11] Patent Number: 5,871,889
[45] Date of Patent: *Feb. 16, 1999

[54] METHOD FOR ELIMINATION OF ALIGNMENT FIELD GAP

[75] Inventors: Jian-Huei Lee; Dong-Hsu Cheng, both of Hsin-Chu, Taiwan

[73] Assignee: Taiwan Semiconductor Manufacting Company, Ltd., Hsin-Chu, Taiwan

[ * ] Notice: This patent issued on a continued prosecution application filed under 37 CFR 1.53(d), and is subject to the twenty year patent term provisions of 35 U.S.C. 154(a)(2).

[21] Appl. No.: 665,326

[22] Filed: Jun. 14, 1996

[51] Int. Cl.⁶ ........................................... G03C 5/00
[52] U.S. Cl. ................. 430/394; 430/5; 430/30; 430/312
[58] Field of Search .................. 430/5, 30, 312, 430/394

[56] References Cited

U.S. PATENT DOCUMENTS

| | | | |
|---|---|---|---|
| 3,615,466 | 10/1971 | Sahni | 96/36.2 |
| 4,131,472 | 12/1978 | MacDonald, Jr. et al. | 96/38.3 |
| 4,677,043 | 6/1987 | Cordes, III et al. | 430/22 |
| 5,281,500 | 1/1994 | Cathey et al. | 430/5 |
| 5,288,568 | 2/1994 | Cathey, Jr. | 430/5 |
| 5,290,711 | 3/1994 | Yanagisawa | 437/20 |
| 5,376,482 | 12/1994 | Hwang et al. | 430/5 |

*Primary Examiner*—Nam Nguyen
*Assistant Examiner*—Steven H. Versteeg
*Attorney, Agent, or Firm*—George O. Saile; Stephen B. Ackerman

[57] ABSTRACT

A method of photomask reticle design provides for greatly increased tolerance to adjacent exposure field alignment and/or stepper magnification errors, thus eliminating gaps between adjacent exposure fields in the fabrication of semiconductor integrated circuit devices. The resulting insurance of complete exposure of photoresist eliminates the formation of non-exposed unwanted photoresist residues or stringers, which constitute defects in the manufacture of such devices.

2 Claims, 5 Drawing Sheets

FIG. 1 - Prior Art

METHOD FOR ELIMINATION OF ALIGNMENT FIELD GAP

BACKGROUND OF THE INVENTION

(1) Field of the Invention

The invention relates to a method for elimination of the gap which may occur between any two slightly misaligned and/or magnified adjacent exposure fields in the photolithographic processes commonly used in the fabrication of semiconductor integrated circuits, and more particularly to a method of design of the photolithographic pattern masks used in the fabrication of integrated circuit devices which eliminates the gap between any two slightly misaligned adjacent exposure fields employed in the device fabrication process which could result in manufacturing defects in such devices.

(2) Description of the Prior Art

In the fabrication of semiconductor integrated circuit devices, materials which comprise the devices must be formed into patterns. This is accomplished by placement of a photosensitive material called a photoresist on the surface of the material and exposing the photoresist to radiation through a pattern called a photomask or reticle. Subsequent chemical development of the exposed pattern provides a mask for both selective etching and selective ion implantation of the underlying material into the corresponding pattern. The complete group of patterns required to form an integrated circuit device is known as a chip, or, when separated as individual sections of semiconductor, as a die. In manufacturing practice, arrays of circuit chips are located on the semiconductor substrate as closely as practicable. In order to do this, the patterns are produced by sequential projection of the photomask images onto the semiconductor surface to form each device chip, and adjacent fields are formed by repetitive image projection after moving the substrate at each step. A field is the exposure area which contains one or more chips. This method of step-and-repeat formations of the device chip images places great emphasis on the ability to align each pattern accurately to those previously fabricated. The most significant alignment accuracy and/or stepper magnification function comes about from the use of various optical techniques to locate and place the image of the reticle before exposure; the term stepper refers collectively to the optical and mechanical systems used to perform these functions.

If the alignment of the field and/or stepper magnification function is not within the desired tolerances for device fabrication, there can exist a separation between adjacent fields where the exposure areas are supposed to overlap and provide complete exposure of the photoresist. Such a separation is known as a field gap, and it can lead to there being a region where the photoresist is non-exposed altogether. This in turn can result in pieces or strings of unexposed photoresist being present on the device surface in the case where a positive-working photoresist is being used. These pieces of photoresist constitute manufacturing defects which are costly due to the potential decrease in yield, the need for increased visual inspection, and the potential for subsequent device functional or reliability problems.

The alignment field gap problems described arise due to the consequences of slight alignment errors at the peripheral regions of any two adjacent fields. In another aspect of integrated circuit device fabrication, a clear region is left as a border around each chip to allow clean separation of individual circuit chips or dies after fabrication is complete. Such clear border regions are known as scribe lines from the method of scribing employed in die separation. Scribe line regions must be kept free of any material or residue which might interfere with clean die separation, and a considerable knowledge and art exists concerning such scribe lines, their formation, and their manipulation, particularly with respect to the concerns over alignment, freedom from stray photoresist residues, etc. For example, U.S. Pat. No. 5,290,711 to Yanagisawa describes the prevention of photoresist formation in the scribe line regions of adjacent device chips, but does not discuss the problem of inadvertent misalignment leading to undesired photoresist exposure, or lack thereof, which might cause the formation of undesired photoresist residues.

SUMMARY OF THE INVENTION

A principal object of the invention is to provide a method of elimination of photoresist residues due to misalignment and/or stepper magnification error of adjacent exposure fields in the photolithographic processes employed in the fabrication of semiconductor integrated circuit devices. A further object of the invention is to improve the design of photolithographic mask reticles useful in the manufacture of semiconductor integrated circuits to eliminate potential defects in said devices caused by misalignment and/or stepper magnification error of adjacent exposure fields which lead to gaps between said exposure fields. In accordance with the object of the invention, a method of photomask or reticle design provides for greatly increased tolerance to adjacent field exposure alignment errors, thus eliminating gaps between adjacent exposure areas. This results in complete exposure of photoresist and eliminates the formation of unexposed photoresist strips or strings, which constitute defects in the manufacture of integrated circuit devices.

The invention provides a method for reducing defect levels in the fabrication of semiconductor integrated circuits resulting from misalignment of adjacent exposure fields of a photomask reticle. A photomask reticle is provided, having a plurality of patterns corresponding to chips on the semiconductor integrated circuit. A first clear border area is added around each of the chip patterns and a second clear border area is added on three sides of the photomask reticle, whereby the first and second clear border areas prevent the non-exposure of photoresist due to misalignment of adjacent exposure fields of the photomask reticle. The clear border areas allow radiation through the photomask reticle to reach a photoresist on the semiconductor integrated circuit.

The invention further provides a method for eliminating defect levels in the fabrication of semiconductor integrated circuits caused by field gap misalignment in step-and-repeat photolithographic manufacturing processes. A photomask reticle is provided having a plurality of chip areas, and a clear border around at least three sides of the photomask reticle. One region of a semiconductor wafer is exposed to radiation through the photomask reticle. The semiconductor wafer is moved, and a region adjacent to the first region is exposed to radiation through the photomask reticle, whereby the clear border prevents photoresist stringer formation if the field gap misalignment occurs. A coating of photoresist material covers the semiconductor wafer.

DESCRIPTION OF THE PREFERRED EMBODIMENT

Figure 1:
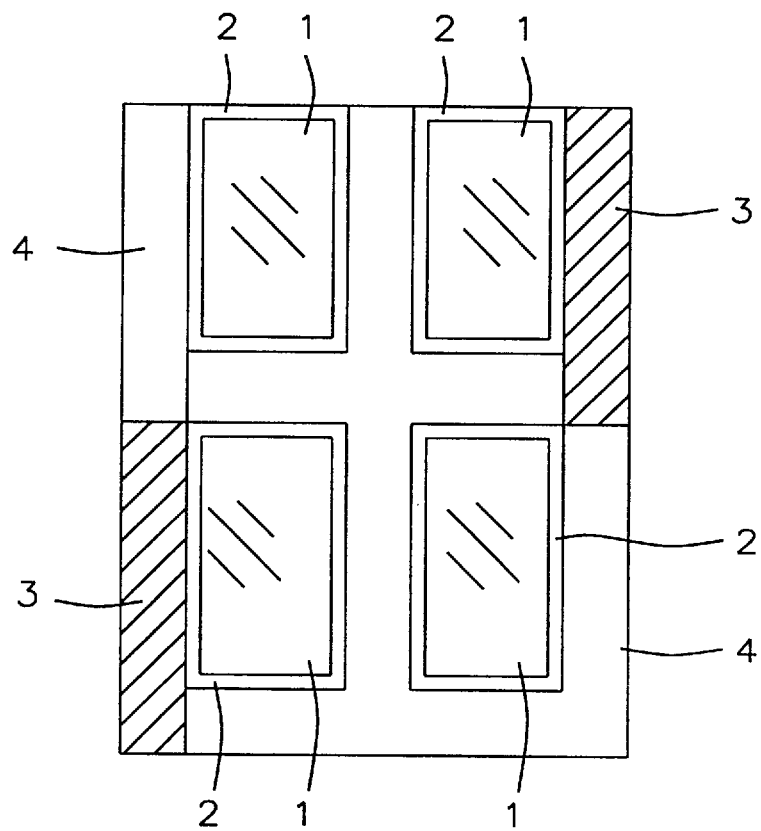
FIG. 1 is a portion of a photomask reticle showing integrated circuit device cells of the prior art.

Referring now more particularly to FIG. 1, there is shown a portion of a photomask reticle of an integrated circuit device chip of the prior art, magnified many times. This portion, or field, consists of four integrated circuit device chip patterns 1, each of which is identical and produced similarly; that is, each chip is produced simultaneously by a single exposure. Surrounding each chip pattern set is a border region 2 known as the seal ring, which will be used in the completion of device fabrication to attach a protective enclosure or package, also known as a cap, to the separated chip or die. Opaque regions 3 and critical dimension bar regions 4 complete the design of the reticle. The critical dimension bars 4 are designed to measure the dimensions of critical processes in the fabrication of the device such as the deposition of polycrystalline silicon, metallic, and insulating layers, for example.

Figure 2:
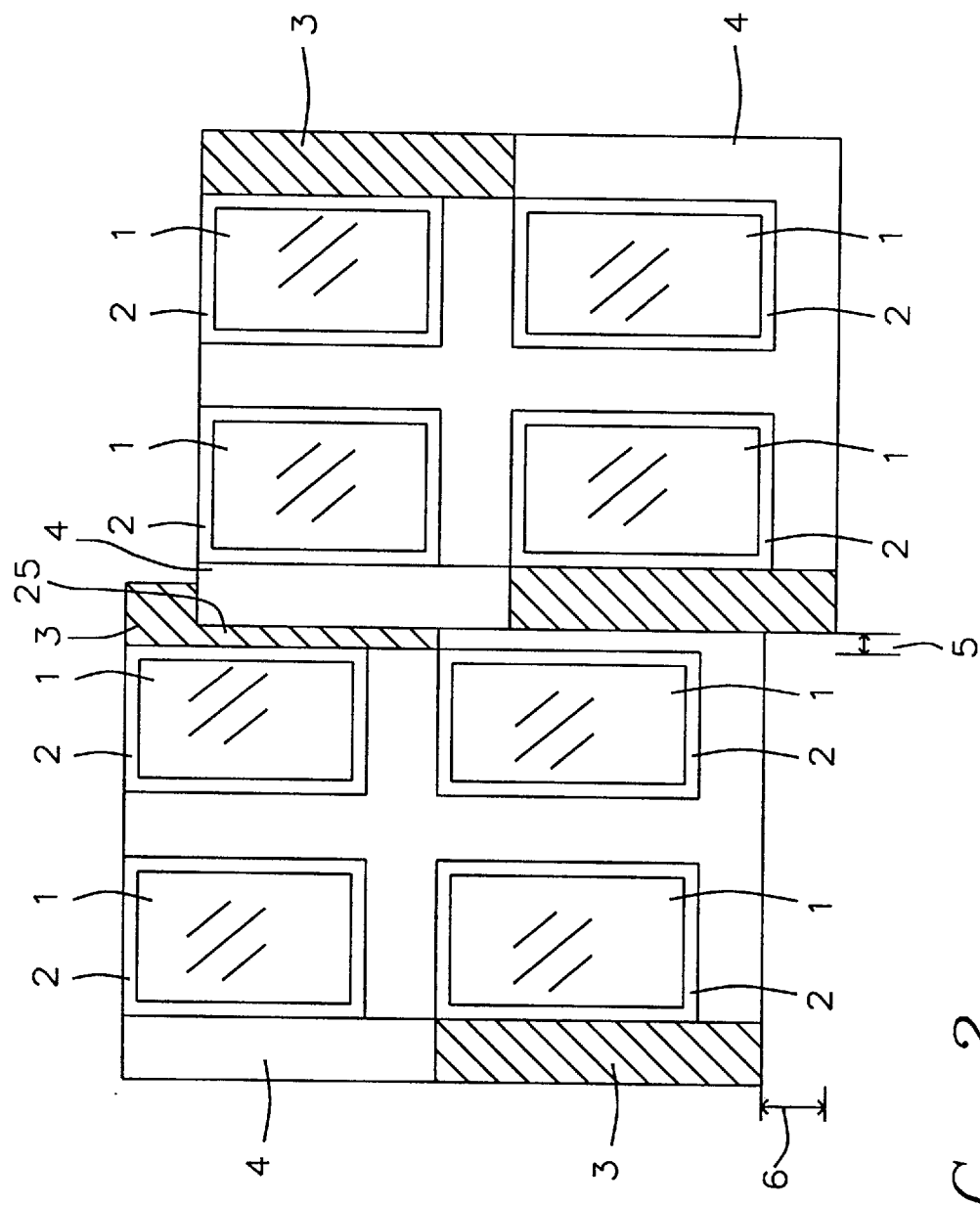
FIG. 2 is a sketch showing the formation of an alignment field gap due to slight misalignment errors of adjacent patterns in the prior art.
Figure 3:
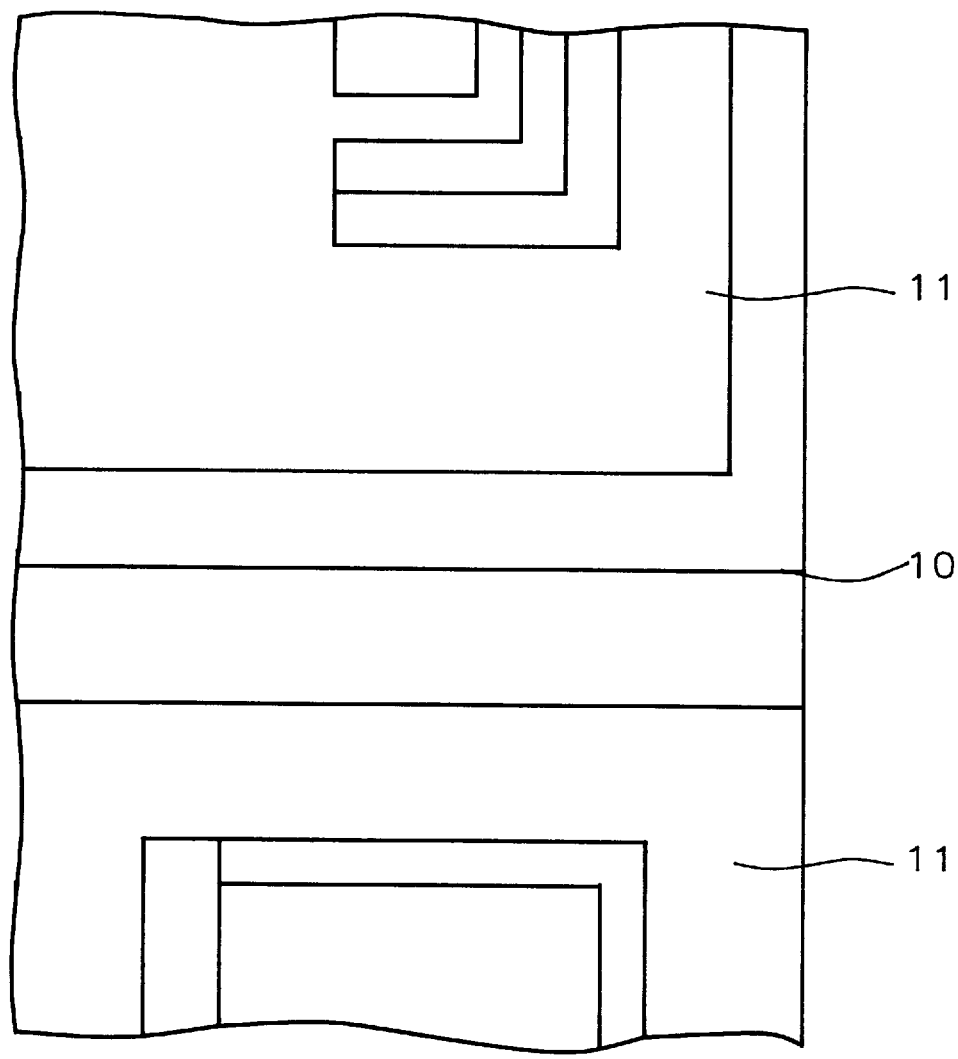
FIG. 3 is a photograph of an alignment field gap-induced photoresist string.

In the manufacture of integrated circuit devices, large numbers of individual circuit cells are produced by successive repetitions of patterns by alignment at each chip location of the pattern to previous patterns thereon, exposure to radiation, and movement or stepping of the optical-mechanical system known as the stepper stage to the next adjacent location. This method is referred to collectively as the step-and-repeat method. The repeat or step distance is the width of the pattern in the direction of movement of the stage. The critical pattern alignments required in the successful fabrication of integrated circuit devices are those within each chip to previously-fabricated patterns, since the accuracy of these pattern alignments determines whether the chip will be functional. Therefore, in accomplishing these critical alignments, less concern is devoted to the accurate juxtaposition of the overall field to the edge of the previously-exposed adjacent exposure field. However, if the edges of the adjacent fields are misaligned owing to either error in stepper stage movement or in stepper magnification, there will be gaps between the exposure fields at these said edges, leading to undesirable consequences. Referring now more particularly to FIG. 2, there is shown a schematic drawing of two adjacent exposure fields of the reticle pattern of FIG. 1 to the same scale wherein there is a degree of misalignment 5 and 6 of the adjacent reticles. Instead of perfectly accurate adjacency of the corresponding critical dimension bar region 4 to opaque region 3, there are portions of the underlying unexposed photoresist between said regions 3 and 4 which will not be exposed to radiation because of the misaligned portions of the critical dimension bar region 4. Thus, regions of photoresist 25 which were intended by design to be exposed to radiation will not become so, and upon subsequent photolithographic development will be present as potential defects by acting as foreign objects, debris, etc. Of particular concern are such photoresist regions of long, narrow aspect ratio, since their relative ease of detachment during processing can result in their moving about and becoming randomly re-deposited on the devices being fabricated, leading to potential defects on devices on the entire substrate. Such long, narrow photoresist residue segments are known as stringers, and a photograph of a typical stringer is shown in FIG. 3, wherein such a stringer 10 is shown located between two adjacent exposure fields 11 which were slightly misaligned.

Figure 4:
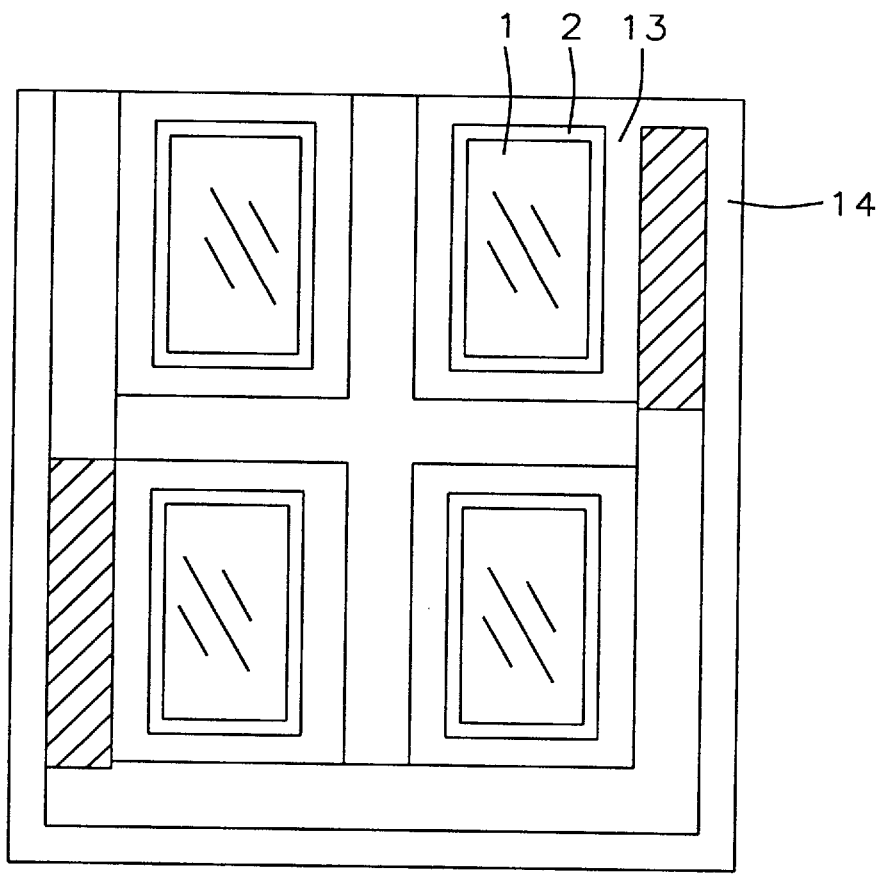
FIG. 4 is a portion of a photomask reticle showing chips with two kinds of dummy rings: the first designed for the chip seal ring, and the second for the periphery of a photomask.
Figure 5:
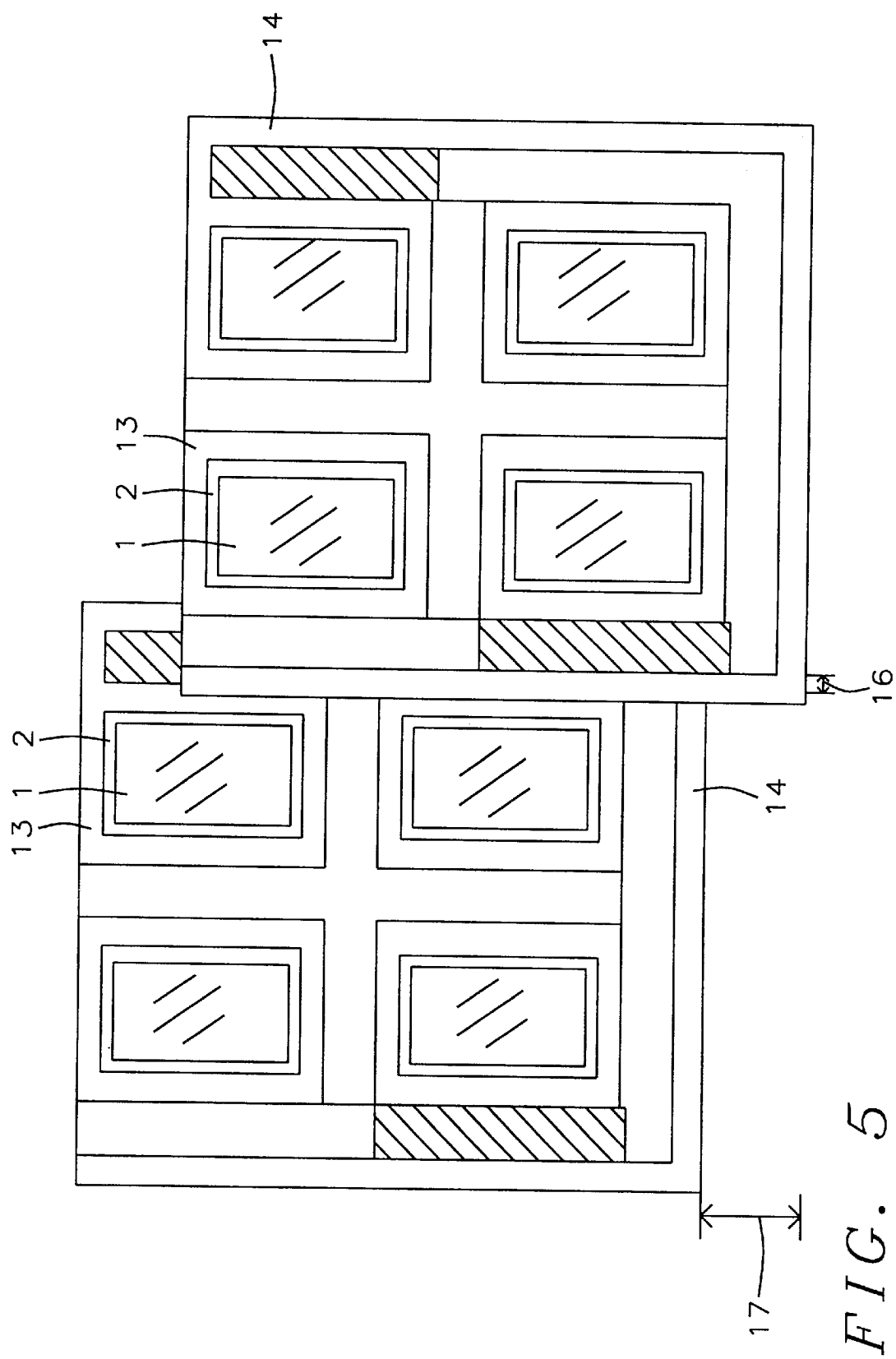
FIG. 5 is a portion of a photomask reticle showing the elimination of an alignment field gap due to slight misalignment and/or stepper magnification error.

Referring now more particularly to FIG. 4, there is shown a schematic drawing of a portion of a photomask reticle of the current invention to the same scale as FIGS. 1 and 2. Around the seal ring 2 of each device chip 1, there is provided a chip clear border region 13. Additionally, the periphery of the entire reticle area has on three sides a reticle clear border region 14. There is no need for a fourth side at the top of the reticle since the bottom and either side regions are sufficient for both x- and y- direction alignment purposes. The purpose of these clear border regions will become apparent upon reference to FIG. 5. Referring now more particularly to the aforesaid FIG. 5, there is shown a schematic drawing of two adjacent exposure fields of a reticle of the current invention, to the same scale and slightly misaligned analogously 16 and 17 to FIG. 2. The additional clear border regions of the current invention prevent the formation of undesired photoresist residues in the misaligned areas by unintentional non-exposure of these said areas, and hence prevent the formation of stringers and other forms of undesired photoresist residues.

The provision of the additional clear border regions in the design of the photomask reticle patterns for integrated circuit fabrication requires only little incremental increase in the overall area required for the production of each chip, hence it only slightly reduces the overall yield of devices per unit area of semiconductor surface under fabrication. The slight increase in the consumption of useful semiconductor area by ther method of the current invention is more than offset by the improved device yield due to the diminished defect levels, and by the reduction in manufacuring cost due to the lessened need for visual inspection, rejection, and rework. In addition, the reduction in potential device reliability due to the presence of the aforesaid defects is minimized.

While the invention has been particularly shown and described with reference to the preferred embodiments thereof, it will be understood by those skilled in the art that various changes in form and detail may be made without departing from the spirit and scope of the invention.

What is claimed is:

1. A method for eliminating defect levels in the fabrication of semiconductor integrated circuits caused by field gap misalignment in step-and-repeat photolithographic manufacturing processes, comprising:

manufacturing a photomask reticle having a plurality of chip areas, and a clear border around at least three sides of said photomask reticle;

exposing one region of a semiconductor wafer to radiation through said photomask reticle;

moving said semiconductor wafer; and exposing a region adjacent to said first region to radiation through said photomask reticle, whereby said clear border prevents photoresist stringer formation if said field gap misalignment occurs.

2. The method of claim 1 wherein a coating of photoresist material covers said semiconductor wafer.

* * * * *